United States Patent
Cai et al.

(10) Patent No.: US 9,634,033 B2
(45) Date of Patent: Apr. 25, 2017

(54) THIN FILM TRANSISTOR AND METHOD OF MANUFACTURING THE SAME, ARRAY SUBSTRATE AND DISPLAY APPARATUS

(71) Applicants: BOE Technology Group Co., Ltd., Beijing (CN); Hefei Xinsheng Optoelectronics Technology Co., Ltd., Anhui (CN)

(72) Inventors: Zhenfei Cai, Beijing (CN); Zhengwei Chen, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 0 days.

(21) Appl. No.: 14/785,408

(22) PCT Filed: Apr. 24, 2015

(86) PCT No.: PCT/CN2015/077361
§ 371 (c)(1),
(2) Date: Oct. 19, 2015

(87) PCT Pub. No.: WO2016/033981
PCT Pub. Date: Mar. 10, 2016

(65) Prior Publication Data
US 2016/0260747 A1    Sep. 8, 2016

(30) Foreign Application Priority Data
Sep. 1, 2014   (CN) .......................... 2014 1 0441698

(51) Int. Cl.
*H01L 27/12* (2006.01)
*H01L 29/78* (2006.01)
(Continued)

(52) U.S. Cl.
CPC .... *H01L 27/1225* (2013.01); *H01L 21/76895* (2013.01); *H01L 23/535* (2013.01);
(Continued)

(58) Field of Classification Search
CPC ............. H01L 27/1225; H01L 29/7869; H01L 21/76895; H01L 27/127; H01L 23/535;
(Continued)

(56) References Cited

U.S. PATENT DOCUMENTS

2003/0119232 A1   6/2003  Kim et al.
2011/0273640 A1*  11/2011 Zhang .................. G02F 1/1309
                                            349/43
(Continued)

FOREIGN PATENT DOCUMENTS

CN          1183570      6/1998
CN       102468341 A     5/2012
(Continued)

OTHER PUBLICATIONS

Second Office Action, including Search Report, for Chinese Patent Application No. 201410441698.0, dated Jan. 4, 2016, 9 pages.
(Continued)

*Primary Examiner* — John C Ingham
*Assistant Examiner* — Didarul Mazumder
(74) *Attorney, Agent, or Firm* — Westman, Champlin & Koehler, P.A.

(57) ABSTRACT

The present disclosure discloses a thin film transistor comprising: an active layer; an etching barrier layer arranged on the active layer and formed with a plurality of via holes therein; and a source electrode and a drain electrode arranged on the etching barrier layer, wherein the source electrode comprises at least two sub source electrodes and the drain electrode comprises at least two sub drain electrodes; and the sub source electrodes and the sub drain
(Continued)

electrodes constitute at least two parallel sub-switches, each of which comprises a sub source electrode and a sub drain electrode, and the sub source electrode and the sub drain electrode are electrically connected to the active layer through the via holes in the etching barrier layer, respectively. The present disclosure further discloses a method of manufacturing a thin film transistor, an array substrate and a display apparatus. The present disclosure employs a multi-channel design with which the DGS problem due to an incomplete active layer is solved by using a plurality of parallel sub-switches, ensuring the normal operation of the pixel and thus increasing yield and useful life of product.

16 Claims, 5 Drawing Sheets

(51) Int. Cl.
*H01L 21/76* (2006.01)
*H01L 29/786* (2006.01)
*H01L 21/768* (2006.01)
*H01L 23/535* (2006.01)

(52) U.S. Cl.
CPC ............ *H01L 27/12* (2013.01); *H01L 27/124* (2013.01); *H01L 27/127* (2013.01); *H01L 27/1288* (2013.01); *H01L 29/786* (2013.01); *H01L 29/7869* (2013.01)

(58) Field of Classification Search
CPC ... H01L 27/1288; H01L 27/124; H01L 21/16; H01L 21/00; H01L 29/24; H01L 21/479
USPC .......................................................... 257/43
See application file for complete search history.

(56) References Cited

U.S. PATENT DOCUMENTS

| | | | | |
|---|---|---|---|---|
| 2012/0146093 A1* | 6/2012 | Shibata | ............... | H01L 29/0619 257/192 |
| 2013/0264564 A1* | 10/2013 | Park | .................. | H01L 29/66742 257/43 |
| 2014/0319498 A1* | 10/2014 | Lee | .................... | H01L 29/41733 257/40 |
| 2015/0236044 A1* | 8/2015 | Kim | ...................... | H01L 27/124 257/72 |

FOREIGN PATENT DOCUMENTS

| | | |
|---|---|---|
| CN | 102629591 | 8/2012 |
| CN | 102916051 | 2/2013 |
| CN | 103489923 | 1/2014 |
| CN | 103811503 | 5/2014 |
| CN | 104218095 | 12/2014 |

OTHER PUBLICATIONS

First Office Action from Chinese Patent Application No. 201410441698.0, dated Aug. 5, 2015.
International Search Report and Written Opinion for PCT Application No. PCT/CN2015/077361, dated Jul. 29, 2015.
English translation of Box No. V of the Written Opinion for the International Searching Authority for PCT Application No. PCT/CN2015/077361, 2 pages.

* cited by examiner

THIN FILM TRANSISTOR AND METHOD OF MANUFACTURING THE SAME, ARRAY SUBSTRATE AND DISPLAY APPARATUS

CROSS-REFERENCE TO RELATED APPLICATION

This application is a Section 371 National Stage Application of International Application No. PCT/CN2015/077361, filed Apr. 24, 2015, entitled "Thin Film Transistor and Method of Manufacturing the Same, Array Substrate and Display Apparatus", which has not yet published, which claims priority to Chinese Patent Application No. 201410441698.0, filed Sep. 1, 2014, in Chinese, the contents of which are hereby incorporated by reference in their entirety.

BACKGROUND OF THE INVENTION

Field of the Invention

The present disclosure relates to the field of display technology, and particularly, to a thin film transistor (TFT), a method of manufacturing the same, an array substrate and a display apparatus.

Description of the Related Art

An organic light-emitting diode (OLED) display may be made to be lighter and thinner, has a larger visual angle and no radiation, and significantly saves electric energy. Thus, the OLED display dominates in the flat panel display apparatus market, and is considered as the most likely new flat panel display of next generation. In an active matrix OLED, a thin film transistor is provided for each pixel as a switch to control each pixel. The thin film transistor typically comprises a gate electrode 20, a source electrode and a drain electrode 60, a gate insulating layer 30 and an active layer 40, as shown in FIGS. 1a-1d.

Both oxides, such as an indium gallium zinc oxide (IGZO), an indium tin zinc oxide (ITZO) and the like, and amorphous silicon, can be used as materials for manufacturing the active layer of the thin film transistor. Compared to the TFT using the amorphous silicon as material of the active layer (also referred as "amorphous silicon thin film transistor"), the TFT using the oxide as material of the active layer (also referred as "oxide thin film transistor") has a carrier concentration which is about ten times of that of the amorphous silicon thin film transistor, and a carrier mobility which is 20 to 30 times of that of the amorphous silicon thin film transistor. Thus, the oxide thin film transistor can greatly increase charging and discharging rates to a pixel electrode through the thin film transistor and thus increase a response speed of the pixel, thereby achieving a quicker refresh rate. The oxide thin film transistor is applicable in situations where a quick response and a larger current are required, such as a high frequency, high resolution and large-sized display, an organic light emitting display or the like. Therefore, the oxide thin film transistor becomes a semiconductor component for the new generation LCD and OLED display apparatus.

In a manufacturing process of the oxide thin film transistor, it is required to add an etching barrier layer 50 after the active layer (oxide layer) 40 is manufactured to prevent the active layer from being damaged when the metal of the source and drain electrodes is etched, due to the special characteristics of the oxide. However, during the film forming and photo etching process for the active layer, the pattern of the active layer may be incomplete due to dust or the like, which is shown as a star pattern 40a in FIG. 1a. During the subsequent etching process for the etching barrier layer 50, the gate insulating layer 30 below the pattern of the active layer may be etched together, so that a gate line 20 is exposed, as shown in FIGS. 1b and 1c. The exposed gate line 20 may electrically contact the metal of the source and drain electrodes directly, so that a short circuit (DGS) is formed, as shown in FIG. 1d, thereby affecting the product yield seriously.

FIG. 2 is a schematic plan view of an existing thin film transistor, wherein, the numeral reference 20 indicates a gate electrode, the numeral reference 40 indicates an active layer, the numeral reference 50 indicates an etching barrier layer, the numeral reference 310 indicates a data signal line, the numeral reference 320 indicates via holes in the etching barrier layer, the numeral reference 340 indicates a pixel electrode, and the numeral reference 330 indicates via holes above the pixel electrode. In the prior art, after the position where the short circuit occurs is found, as shown by the black circle R in FIG. 2, it is repaired typically by cutting off a source signal input end of a TFT switch, as shown by the black short line L in FIG. 2. After the source signal input end is cut off, however, the corresponding pixel will become a dark pixel, that is, a defect pixel, due to lacking the source driving. If there are a plurality of short circuit positions on a display panel, a plurality of defect pixels will be generated after repair. As the display panel on which there are a plurality of defect pixels cannot be normally used, it should be disposed as scrap, thereby affecting the useful life of the display panel greatly.

SUMMARY OF THE INVENTION

In order to solve the above problems in the prior art, embodiments of the present disclosure provide a thin film transistor and a method of manufacturing the same, and an array substrate and a display apparatus.

According to an aspect of the present disclosure, there is provided a thin film transistor comprising: an active layer; an etching barrier layer arranged on the active layer and formed with a plurality of via holes therein; and a source electrode and a drain electrode arranged on the etching barrier layer, wherein, the source electrode comprises at least two sub source electrodes and the drain electrode comprises at least two sub drain electrodes; and the sub source electrodes and the sub drain electrodes constitute at least two parallel sub-switches, each of which comprises a sub source electrode and a sub drain electrode, and the sub source electrode and the sub drain electrode are electrically connected to the active layer through the via holes in the etching barrier layer, respectively.

According to an embodiment, the number of the via holes in the etching barrier layer is equal to or greater than 4.

According to an embodiment, the plurality of via holes are formed in the etching barrier layer in a regular arrangement or in an irregular arrangement, and wherein the sub source electrodes are formed over some via holes and the sub drain electrodes are formed over the other via holes.

According to an embodiment, the number of the via holes in the etching barrier layer is an even number and the via holes are arranged in two rows parallel with each other, the respective sub source electrodes of the source electrode being electrically connected to the active layer through the via holes in one row and the respective sub drain electrodes of the drain electrode being electrically connected to the active layer through the via holes in the other row.

According to an embodiment, the via holes in one row are aligned with the via holes in the other row, respectively.

According to an embodiment, the active layer is made of metal oxide semiconductor material.

According to an embodiment, the thin film transistor further comprises a passivation layer arranged on the source electrode and the drain electrode.

According to another aspect of the present disclosure, there is provided an array substrate comprising the above thin film transistor.

According to an embodiment, the array substrate further comprises a pixel electrode and a data signal line, wherein one end of each sub-switch is connected to the data signal line and the other end of each sub-switch is connected to the pixel electrode.

According to another aspect of the present disclosure, there is provided a display apparatus comprising the above array substrate.

According to a further aspect of the present disclosure, there is provided a method of manufacturing a thin film transistor, comprising:

forming an etching barrier material layer on an active layer, and patterning the etching barrier material layer to form an etching barrier layer in which a plurality of via holes are formed; and forming an electrode material layer on the etching barrier layer and patterning the electrode material layer to form a source electrode and a drain electrode;

wherein patterning the electrode material layer comprises:

forming at least two sub source electrodes and at least two sub drain electrodes, so that the sub source electrodes and the sub drain electrodes constitute at least two parallel sub-switches, each of which comprises a sub source electrode and a sub drain electrode, the sub source electrode and the sub drain electrode being electrically connected to the active layer through the via holes in the etching barrier layer, respectively.

According to an embodiment, the number of the via holes in the etching barrier layer is equal to or greater than 4.

According to an embodiment, the plurality of via holes are formed in the etching barrier layer in a regular arrangement or in an irregular arrangement, and wherein the sub source electrodes are formed over some via holes and the sub drain electrodes are formed over the other via holes.

According to an embodiment, the number of the via holes in the etching barrier layer is an even number and the via holes are arranged in two rows parallel with each other, the respective sub source electrodes of the source electrode being electrically connected to the active layer through the via holes in one row and the respective sub drain electrodes of the drain electrode being electrically connected to the active layer through the via holes in the other row.

According to an embodiment, the via holes in one row are aligned with the via holes in the other row, respectively.

According to an embodiment, the active layer is made of metal oxide semiconductor material.

According to an embodiment, the method further comprises: forming a passivation layer on the source electrode and the drain electrode after forming the source electrode and the drain electrode.

According to an embodiment, the method further comprises:

forming a gate and a gate insulating layer on a substrate in sequence; and forming a semiconductor layer on the gate insulating layer, and patterning the semiconductor layer to form the active layer.

Embodiments of the present invention employ a multi-channel design, in which the number of sub-switches is increased while the width of the active layer is not changed. Each sub-switch is an independent control unit and all the sub-switches constitute a sub-switch group connected in parallel for controlling one pixel. If the DGS problem occurs in any of the sub-switches due to the incomplete active layer, the source signal input end of the corresponding sub-switch is cut off by laser, so that only one sub-switch is required to be broken and other sub-switches in parallel with it may operate normally, ensuring the normal operation of the pixel and thus increasing yield and useful life of product.

DETAILED DESCRIPTION OF PREFERRED EMBODIMENTS OF THE INVENTION

In order to provide a more clear understanding of objects, technique solutions and advantages of the present invention, the present invention will be further described hereinafter in detail in conjunction with specific embodiments and with reference to the attached drawings.

Figure 1A:
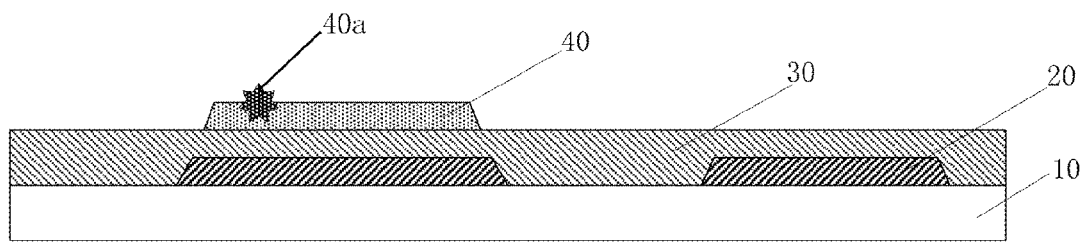
FIGS. 1a-1d are schematic views showing the principle of the DGS phenomenon occurred in the prior art.
Figure 1B:
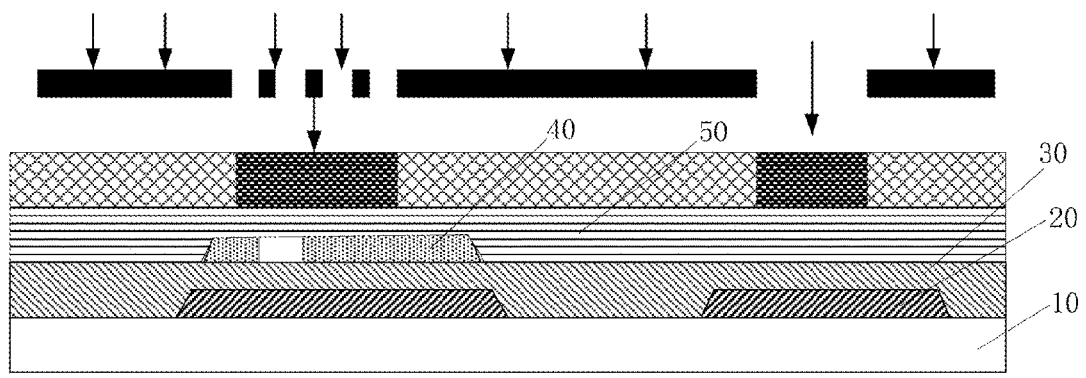
Figure 1C:
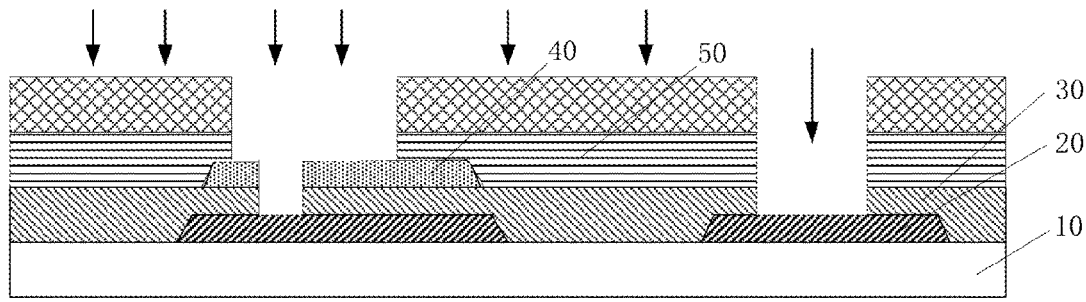
Figure 1D:
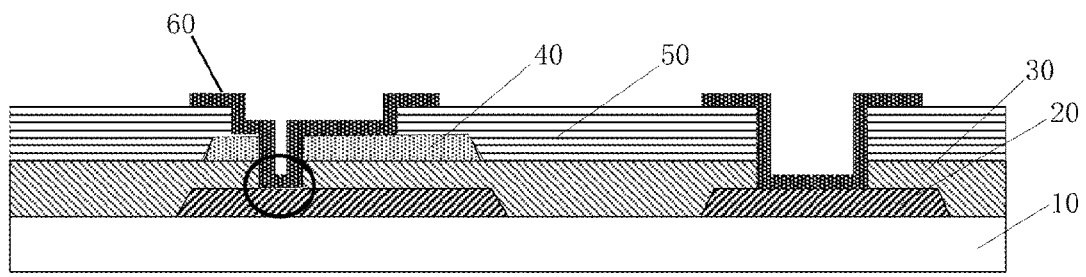
Figure 2:
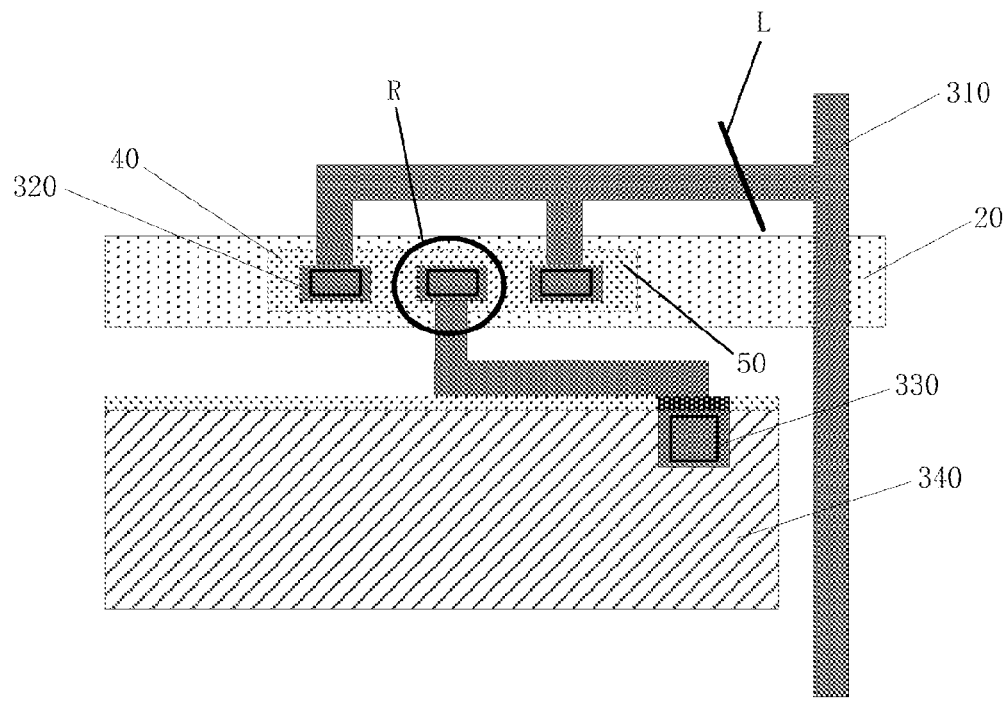
FIG. 2 is a schematic plan view of a thin film transistor in the prior art.
Figure 3:
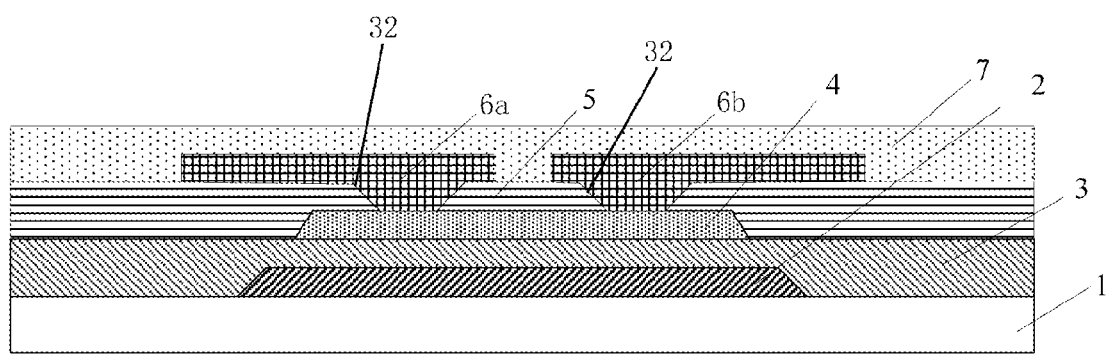
FIG. 3 is a schematic section view of a thin film transistor according to an embodiment of the present invention.

According to an aspect of the present invention, a thin film transistor is provided. As shown in FIG. 3, the thin film transistor comprises a substrate 1, a gate electrode 2, a gate insulating layer 3, an active layer 4, an etching barrier layer 5, a source electrode 6a and a drain electrode 6b.

Wherein, the gate electrode 2, the gate insulating layer 3 and the active layer 4 are formed above the substrate 1 in sequence.

The etching barrier layer 5 is formed on the active layer 4 to protect the active layer 4 in a channel region between the source electrode and the drain electrode from a developer solution and an etching solution, and a plurality of via holes 32 are formed in the etching barrier layer 5.

The number of the via holes 32 may be equal to or greater than 4.

The source electrode 6a and the drain electrode 6b are formed on the etching barrier layer 5, and the source electrode and the drain electrode are electrically connected through the active layer 4 by using the plurality of via holes 32 in the etching barrier layer 5.

Figure 4:
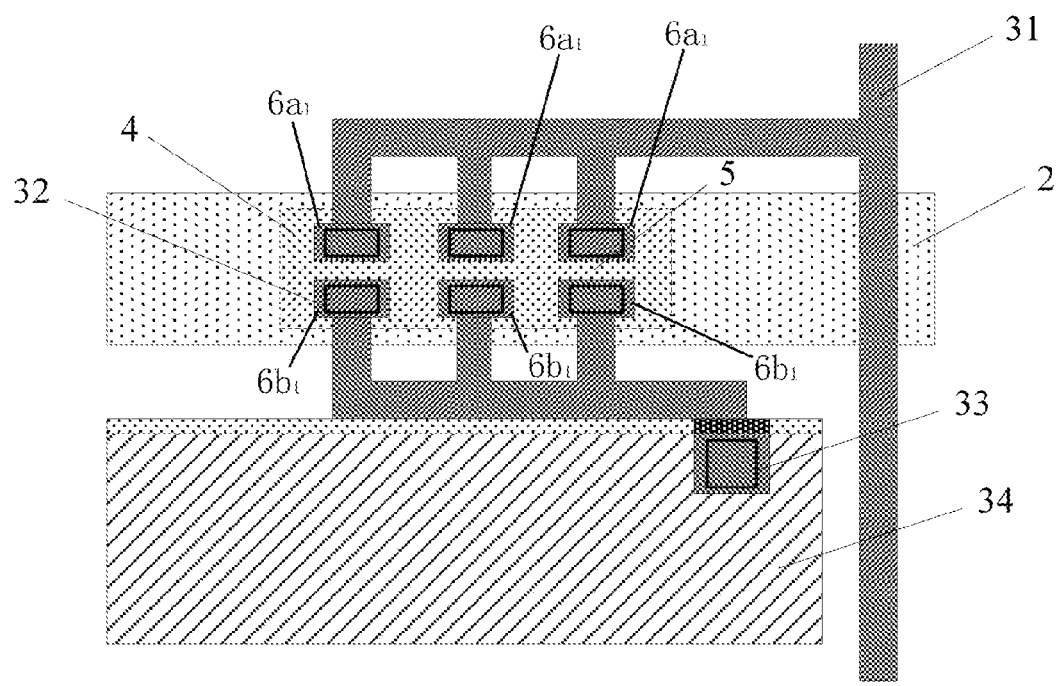
FIG. 4 is a schematic plan view of a thin film transistor according to an embodiment of the present invention.

According to an embodiment of the present invention, as shown in FIG. 4, the source electrode 6a comprises three sub source electrodes 6a1, and the drain electrode 6b comprises three sub drain electrodes 6b1. The sub source electrodes 6a1 and the sub drain electrodes 6b1 constitute at least two parallel sub-switches, each of which comprises a sub source electrode 6a1 and a sub drain electrode 6b1, and the sub source electrode 6a1 and the sub drain electrode 6b1 are electrically connected to the active layer 4 through the via holes 32 in the etching barrier layer 5, respectively.

As such, when power is supplied, the source electrode 6a and the drain electrode 6b form multiple channels through the plurality of via holes 32 in the etching barrier layer 5. In an embodiment of the present invention, as shown in FIG. 4, the number of the via holes 32 in the etching barrier layer 5 is an even number, and the via holes 32 are arranged in two rows parallel with each other; the source electrode 6a is connected to the active layer 4 though one row of via holes and the drain electrode 6b is connected to the active layer 4 though the other row of via holes. In the embodiment, the source electrode 6a and the drain electrode 6b form the multiple channels through via holes 32 arranged in a column direction, respectively; the direction of the channels is parallel to the direction of the signal lines of the source and drain electrodes. In FIG. 4, the source electrode 6a is connected to a data signal line 31 and the drain electrode 6b is connected to the pixel electrode 34 through a via hole 33. As such, each pair of sub source electrode 6a1 and sub drain electrode 6b1 may be used as a sub-switch capable of being controlled independently, and all the sub-switches constitute a sub-switch group connected in parallel for controlling one pixel. If the DGS problem occurs in a position corresponding to a sub source electrode or a sub drain electrode of a certain sub-switch in the sub-switch group, only a corresponding signal input end of the sub-switch may be cut off and other sub-switches in parallel with the sub-switch may keep working, so that a case in which the whole pixel fails to be driven and thus becomes a defect pixel due to the DGS problem, which may occur in the prior art, will be prevented, thereby increasing the product yield.

In other embodiments, the number and the arrangement of the via holes may be flexibly set as required. For example, if permitted by the manufacturing process, the number of the via holes may be flexibly set to be any number equal to or more than four. That is, as long as the plurality of sub source electrodes and the plurality of sub drain electrodes connected through the via holes constitute at least two parallel sub-switches. The plurality of via holes may be arranged in parallel or in a staggered manner, may be arranged in two rows or in more than two rows, or may be in a regular arrangement or in an irregular arrangement. The number of the via holes connected with the source electrode may be same as or different from that of the via holes connected with the drain electrode. It should be noted that, a corresponding relationship between the via holes connected with the source electrode and the via holes connected with the drain electrode may be determined by a corresponding arrangement of positions of the active layers.

Figure 5:
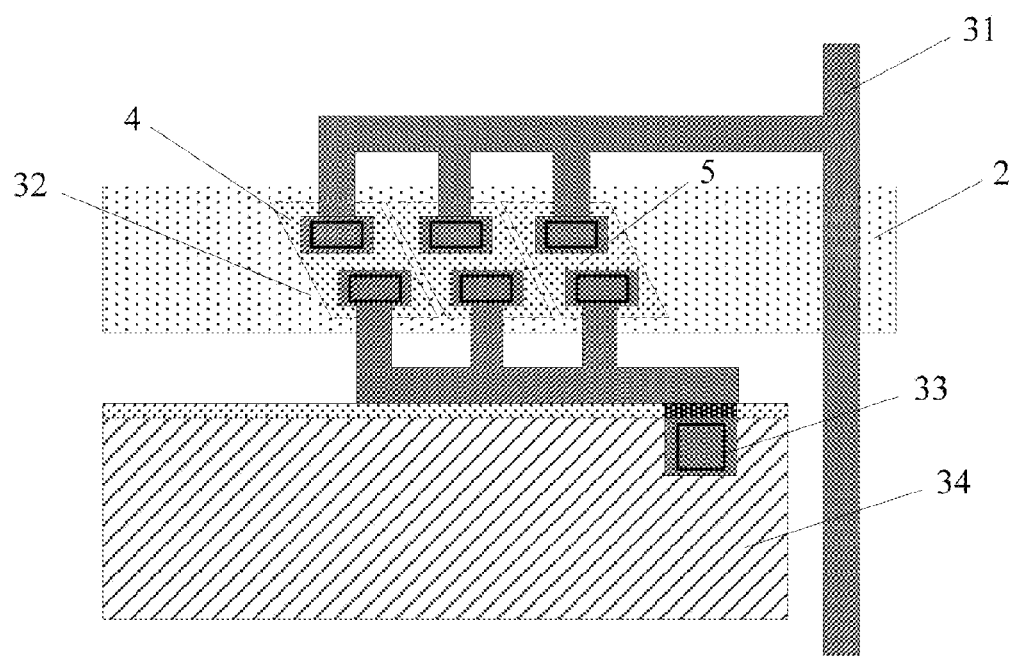
FIG. 5 is a schematic plan view of a thin film transistor according to another embodiment of the present invention.

FIG. 5 is an overall schematic view of a thin film transistor according to another embodiment of the present invention. In FIG. 5, six via holes 32 are in a staggered arrangement, wherein three upper via holes connect the source electrode and the active layer 4 and three lower via holes connect the drain electrode and the active layer 4. The corresponding relationship between the via holes connected with the source electrode and the via holes connected with the drain electrode is deter mined by a plurality of oblique active layers 4 arranged independently.

Except the above description, the number and the arrangement of the via holes 32 and the manner connecting the via holes 32 with the source or drain electrodes are not particularly limited in the present disclosure, as long as the connection between the source electrode or the drain electrode and the active layer may be achieved as required.

Additionally, it should be noted that, the connection manner between the source electrode and the data signal line, and the connection manner between the drain electrode and the pixel electrode may be flexibly set as required, for example, the source electrodes corresponding to each via hole may be directly connected to the data signal line or may be connected to the data signal line through a signal line led out from the data signal line in consideration of the positions of the via holes; the drain electrodes corresponding to each via hole may also be flexibly set in a similar way. The connection manner between the source electrode and the data signal line, and the connection manner between the drain electrode and the pixel electrode are not particularly limited in the present disclosure, and all the connection manners by which the source electrode can be effectively connected with the data signal line and the drain electrode can be effectively connected with the pixel electrode fall in the scope of the present invention.

Optionally, a material for manufacturing the substrate 1 may include glass, silicon, quartz, plastic or the like, and typically may be glass.

In an embodiment, the gate electrode 2 is made of conductive material, such as metal or semiconductor material, and typically metal material.

In an embodiment, the gate insulating layer 3 is made of an insulating material, which may include silicon dioxide, silicon nitride, silicon oxynitride or the like, or a combination thereof.

In an embodiment, the active layer 4 is made of a metal oxide semiconductor material, and typically, an oxide semiconductor material having high carrier mobility, such as zinc oxynitride (ZnON), indium gallium zinc oxide (IGZO), indium zinc oxide (IZO), indium tin zinc oxide (ITZO) or the like.

In an embodiment, the etching barrier layer 5 is made of material(s) resistant to the developer solution and the etching solution, such as one or more of silicon oxide (SiOx), silicon nitride (SiNx), hafnium oxide (HfOx) and silicon oxynitride (SiON). The material such as the silicon oxide (SiOx) is not sensitive to the developer solution and the etching solution for etching source and drain electrodes and has a good dielectric property and a property resistant to moisture and oxygen, thus the active layer 4 made of the above material can be prevented from be adversely affected by the developer solution and the etching solution for etching source and drain electrodes, thereby meeting the requirements of properties of the metal oxide thin film transistor.

In an embodiment, the source electrode 6a and the drain electrode 6b are made of conductive materials, which are typically metal materials, for example, common metals such as aluminum, zinc, tin, molybdenum, tungsten, titanium or the like, or metal alloy materials.

In the embodiment, though the reference numeral 6a is defined as corresponding to the source electrode and the reference numeral 6b is defined as corresponding to the drain electrode, positions of the source electrode and the drain electrode are not particularly limited in the present disclosure, because whether an electrode located in a specific position is a source electrode or a drain electrode will be determined according to its connection relationship to a pixel electrode. In the present disclosure, an electrode connected to a pixel electrode is defined as a drain electrode.

In an embodiment of the present disclosure, as shown in FIG. 3, the thin film transistor further comprises a passivation layer 7 which is disposed on the source electrode and the drain electrode.

In the thin film transistor according to any of the above embodiments, a multi-channel design is used, in which the number of sub-switches is increased while the width of the active layer is not changed. Each sub-switch is an independent control unit and all the sub-switches constitute a sub-switch group connected in parallel for controlling one pixel. If the DGS problem occurs in any of the sub-switches due to the incomplete active layer, the source signal input end of the corresponding sub-switch can be cut off by laser, so that only one sub-switch is required to be broken and other sub-switches in parallel with it may operate normally, thereby ensuring the normal operation of the pixel and thus increasing yield and useful life of product.

According to another aspect of the present disclosure, there is provided an array substrate comprising the thin film transistor according to any of the above embodiments.

According to another aspect of the present disclosure, there is provided a display apparatus comprising the above array substrate.

According to further another aspect of the present disclosure, a method of manufacturing a thin film transistor is provided, and the method of manufacturing a thin film transistor comprises the following steps.

Figure 6A:
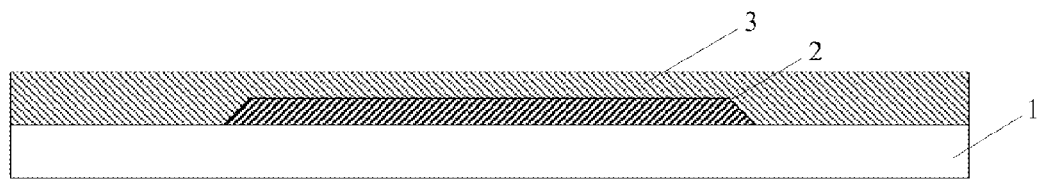
FIGS. 6a-6e are a schematic view showing a process of manufacturing a thin film transistor according to an embodiment of the present invention.

In step 1, a gate material layer and a gate insulating material layer are formed on the substrate 1 and are patterned to form a gate electrode 2 and a gate insulating layer 3 in sequence, as shown in FIG. 6a.

Optionally, a material for manufacturing the substrate 1 may include glass, silicon, quartz, plastic or the like, and typically, is glass.

The gate electrode 2 may be made of conductive material, such as metal or semiconductor material, and typically, metal material.

Optionally, the gate insulating layer 3 may be deposited by a CVD process, and is made of, typically, an insulating material, which includes silicon dioxide, silicon nitride, silicon oxynitride or the like, or a combination thereof.

Figure 6B:
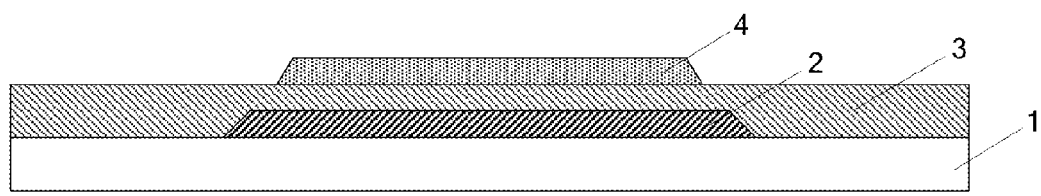

In step 2, a semiconductor layer is formed on the gate insulating layer 3, and is patterned to form an active layer 4, as shown in FIG. 6b.

In the embodiment, the material of the active layer 4 may be a metal oxide semiconductor material, and typically, be an oxide semiconductor material having high carrier mobility, such as zinc oxynitride (ZnON), indium gallium zinc oxide (IGZO), indium zinc oxide (IZO), indium tin zinc oxide (ITZO) or the like.

In the embodiment, the semiconductor layer may be formed through a sputtering process or a plasma enhanced chemical vapor deposition (PECVD) process. The process for forming the semiconductor layer is not particularly limited in the present disclosure.

Optionally, the semiconductor layer may be patterned through a common patterning process, such as a gray scale mask exposure process, an etching process or the like, so as to form the active layer 4.

Figure 6C:
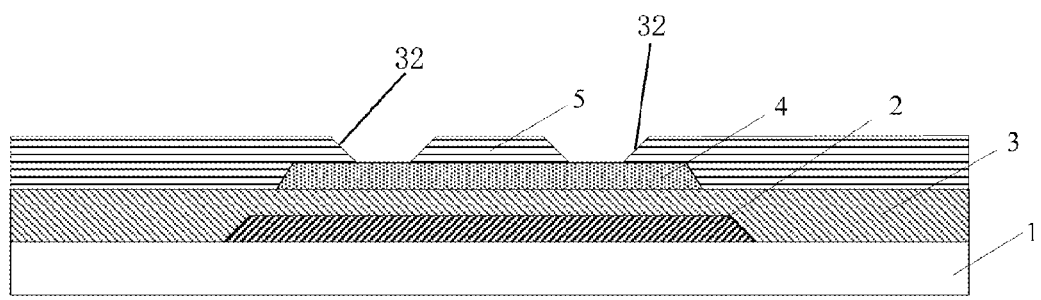

In step 3, an etching barrier material layer is formed on the active layer 4 and is patterned so as to form an etching barrier layer 5, in which a plurality of via holes 32 are formed, as shown in FIG. 6c. The etching barrier layer 5 is used to protect the active layer 4 between the source electrode and the drain electrode from a developer solution and an etching solution.

The etching barrier material layer may be formed through a common semiconductor forming process, such as PECVD or the like.

The patterning may be performed by common patterning processes, such as exposure, development, etching or the like.

After patterning, the plurality of via holes 32 are formed in the etching barrier layer 5. The number of the via holes is equal to or greater than 4.

The etching barrier layer may be made of material(s) that is resistant to the developer solution and the etching solution, such as one or more of silicon oxide (SiOx), silicon nitride (SiNx), hafnium oxide (HfOx) and silicon oxynitride (SiON). The material such as the silicon oxide (SiOx) is not sensitive to the developer solution and the etching solution for etching source and drain electrodes and has a good dielectric property and a property resistant to moisture and oxygen, thus the active layer 4 made of such material can be prevented from be adversely affected by the developer solution and the etching solution for etching source and drain electrodes, thereby meeting requirements of properties of the metal oxide thin film transistor.

Figure 6D:
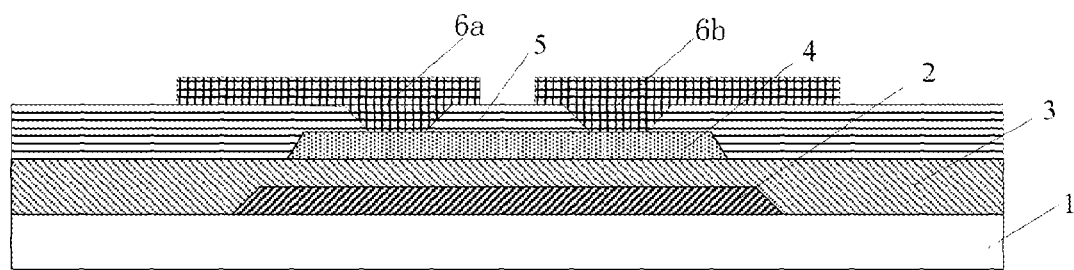

In step 4, an electrode material layer is formed on the etching barrier layer 5, and is patterned to form a source electrode 6a and a drain electrode 6b, as shown in FIG. 6d. The source electrode 6a and the drain electrode 6b are connected through the active layer 4 by using the plurality of via holes 32 in the etching barrier layer 5. The pattern of the formed source electrode 6a and drain electrode 6b may be that shown in FIG. 4 or FIG. 5.

Specifically, patterning the electrode material layer comprises: forming at least two sub source electrodes 6a1 and at least two sub drain electrodes 6b1, so that the sub source electrodes 6a1 and the sub drain electrodes 6b1 constitute at least two parallel sub-switches, each of which comprises a sub source electrode 6a1 and a sub drain electrode 6b1. The sub source electrode 6a1 and the sub drain electrode 6b1 are electrically connected to the active layer 4 through the via holes 32 in the etching barrier layer 5, respectively.

The electrode material layer may be made of conductive materials, which is typically metal material, for example, common metals such as aluminum, zinc, tin, molybdenum, tungsten, titanium or the like, or metal alloy materials.

Optionally, the source electrode 6a and the drain electrode 6b may be formed by common patterning processes, such as exposure, development, etching or the like.

Specific classification of the source electrode and the drain electrode are not particularly limited in the present disclosure, because whether an electrode located in a specific position is a source electrode or a drain electrode will be determined according to its connection relationship to a pixel electrode. In the present disclosure, an electrode connected to a pixel electrode is defined as a drain electrode.

As such, when power is supplied, the source electrode and the drain electrode form multiple channels through the plurality of via holes in the etching barrier layer. In an embodiment of the present invention, the number of the via holes in the etching barrier layer is an even number, and the via holes are arranged in two rows parallel with each other; the source electrode is connected to the active layer 4 though one row of via holes and the drain electrode is connected to the active layer 4 though the other row of via holes. In the embodiment, the source electrode and the drain electrode form the multiple channels through the via holes 32 arranged in a column direction, respectively; the direction of the channels is parallel to the direction of the signal lines of the source and drain electrodes, as shown in FIG. 4. In FIG. 4, the source electrode is connected to a data signal line 31 and the drain electrode is connected to the pixel electrode 34 through a via hole 33. As such, each pair of sub source electrode and sub drain electrode may be used as a sub-switch capable of being controlled independently, and all the sub-switches constitute a sub-switch group connected in parallel for controlling one pixel. If the DGS problem occurs in a position corresponding to a sub source electrode or a sub drain electrode of a certain sub-switch in the sub-switch group, only a corresponding signal input end of the sub-switch may be cut off and other sub-switches in parallel with the sub-switch may keep working, so that a case in which the whole pixel fails to be driven and thus becomes a defect pixel due to the DGS problem, which may occur in the prior art, will be prevented, thereby increasing the product yield.

The number and the arrangement of the via holes may be flexibly set as required. For example, if permitted by the manufacturing process, the number of the via holes may be any number equal to or more than four. The plurality of via holes may be arranged in parallel or in a staggered manner, may be arranged in two rows or in more than two rows, or may be in a regular arrangement or in an irregular arrangement. The number of the via holes connected with the source electrode may be same as or different from that of the via holes connected with the drain electrode. It should be noted that, a corresponding relationship between the via holes connected with the source electrode and the via holes connected with the drain electrode may be determined by a corresponding arrangement of positions of the active layers.

Except the above description, the number and the arrangement of the via holes and the manner connecting the via holes with the source or drain electrodes are not particularly limited in the present disclosure, as long as the connection between the source electrode or the drain electrode and the active layer may be achieved as required.

Additionally, it should be noted that, the connection manner between the source electrode and the data signal line, and the connection manner between the drain electrode and the pixel electrode may be flexibly set as required. For example, the source electrodes corresponding to each via hole may be directly connected to the data signal line or may be connected to the data signal line through a signal line led out from the data signal line in consideration of positions of the via holes; the drain electrodes corresponding to each via hole may also be flexibly set in a similar way. The connection manner between the source electrode and the data signal line, and the connection manner between the drain electrode and the pixel electrode are not particularly limited in the present disclosure, and all the connection manners by which the source electrode is effectively connected with the data signal line and the drain electrode is effectively connected with the pixel electrode fall in the scope of the present invention.

In an embodiment of the present disclosure, the method further comprises the following step 5.

Figure 6E:
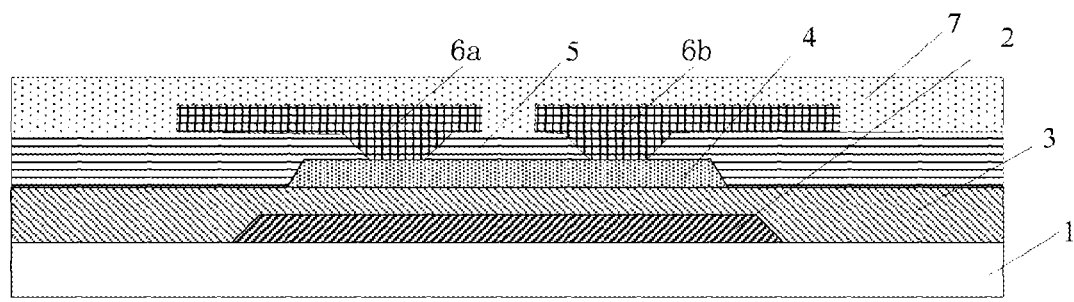

In step 5, a passivation layer 7 is formed on the source electrode and the drain electrode 6, as shown in FIG. 6e.

In the thin film transistor according to any of the above embodiments, a multi-channel design is used, in which the number of sub-switches is increased while the width of the active layer is not changed. Each sub-switch is an independent control unit and all the sub-switches constitute a sub-switch group connected in parallel for controlling one pixel. If the DGS problem occurs in any of the sub-switches due to the incomplete active layer, the source signal input end of the corresponding sub-switch can be cut off by laser, so that only one sub-switch is required to be broken and other sub-switches in parallel with it may operate normally, thereby ensuring the normal operation of the pixel and thus increasing yield and useful life of product.

Although the purposes, technical solutions and advantageous effects of the present invention have been explained in the above embodiments, it should be understood that the above description is merely used to illustrate specific embodiments of the present invention, but not to limit the present invention. All of changes, equivalent alternatives, improvements, made within principles and spirit of the disclosure, should fall in the scope of the present invention.

What is claimed is:

1. A thin film transistor comprising:
   an active layer, the active layer is made of metal oxide semiconductor material;
   an etching barrier layer arranged on the active layer and formed with a plurality of via holes therein; and
   a source electrode and a drain electrode arranged on the etching barrier layer, wherein:
   the source electrode comprises at least two sub source electrodes and the drain electrode comprises at least two sub drain electrodes; and
   the sub source electrodes and the sub drain electrodes constitute at least two parallel sub-switches, each of which comprises a sub source electrode and a sub drain electrode, and the sub source electrode and the sub drain electrode are electrically connected to the active layer through the via holes in the etching barrier layer, respectively;
   wherein the number of the via holes in the etching barrier layer is an even number and the via holes are arranged in two rows parallel with each other, the respective sub source electrodes of the source electrode being electrically connected to the active layer through the via holes in one row and the respective sub drain electrodes of the drain electrode being electrically connected to the active layer through the via holes in the other row.

2. The thin film transistor according to claim 1, wherein the number of the via holes in the etching barrier layer is equal to or greater than 4.

3. The thin film transistor according to claim 1, wherein the plurality of via holes are formed in the etching barrier layer in a regular arrangement or in an irregular arrangement, and wherein the sub source electrodes are formed over some via holes and the sub drain electrodes are formed over the other via holes.

4. The thin film transistor according to claim 1, wherein the via holes in one row are aligned with the via holes in the other row, respectively.

5. The thin film transistor according to claim 1, further comprising a passivation layer arranged on the source electrode and the drain electrode.

6. An array substrate, comprising the thin film transistor according to claim 1.

7. The array substrate according to claim 6, further comprising a pixel electrode and a data signal line, wherein one end of each sub-switch is connected to the data signal line and the other end of each sub-switch is connected to the pixel electrode.

8. A display apparatus, comprising the array substrate according to claim 6.

9. A method of manufacturing a thin film transistor, comprising:
   forming an etching barrier material layer on an active layer, and patterning the etching barrier material layer to form an etching barrier layer in which a plurality of via holes are formed, the active layer is made of metal oxide semiconductor material; and
   forming an electrode material layer on the etching barrier layer and patterning the electrode material layer to form a source electrode and a drain electrode;
   wherein patterning the electrode material layer comprises:
   forming at least two sub source electrodes and at least two sub drain electrodes, so that the sub source electrodes and the sub drain electrodes constitute at least two parallel sub-switches, each of which comprises a sub source electrode and a sub drain electrode, the sub source electrode and the sub drain electrode being electrically connected to the active layer through the via holes in the etching barrier layer, respectively;

wherein the number of the via holes in the etching barrier layer is an even number and the via holes are arranged in two rows parallel with each other, the respective sub source electrodes of the source electrode being electrically connected to the active layer through the via holes in one row and the respective sub drain electrodes of the drain electrode being electrically connected to the active layer through the via holes in the other row.

10. The method according to claim 9, wherein the number of the via holes in the etching barrier layer is equal to or greater than 4.

11. The method according to claim 9, wherein the plurality of via holes are formed in the etching barrier layer in a regular arrangement or in an irregular arrangement, and wherein the sub source electrodes are formed over some via holes and the sub drain electrodes are formed over the other via holes.

12. The method according to claim 9, wherein the via holes in one row are aligned with the via holes in the other row, respectively.

13. The method according to claim 9, further comprising:

forming a passivation layer on the source electrode and the drain electrode after forming the source electrode and the drain electrode.

14. The method according to claim 9, further comprising:

forming a gate and a gate insulating layer on a substrate in sequence; and forming a semiconductor layer on the gate insulating layer, and patterning the semiconductor layer to form the active layer.

15. An array substrate, comprising the thin film transistor according to claim 2.

16. An array substrate, comprising the thin film transistor according to claim 3.

* * * * *